United States Patent [19]
Nguyen

[11] Patent Number: 5,796,309
[45] Date of Patent: Aug. 18, 1998

[54] TEMPERATURE COMPENSATED WIDE DYNAMIC RANGE POWER DETECTION CIRCUITRY FOR PORTABLE RF TRANSMISSION TERMINALS

[75] Inventor: Dien M. Nguyen, Carlsbad, Calif.

[73] Assignee: Nippondenso Co., Ltd., Kariya, Japan

[21] Appl. No.: 677,333

[22] Filed: Jul. 2, 1996

[51] Int. Cl.$^6$ .................. H03F 1/30; H03G 3/20
[52] U.S. Cl. .................. 330/289; 330/110; 330/140
[58] Field of Search .................. 330/110, 141, 330/279, 281, 289, 140; 327/350, 513

[56] References Cited

U.S. PATENT DOCUMENTS

| | | | |
|---|---|---|---|
| 3,904,971 | 9/1975 | Delagrange | 330/141 X |
| 4,263,560 | 4/1981 | Ricker | 330/279 X |
| 4,523,155 | 6/1985 | Walczak et al. | 330/279 |
| 4,560,949 | 12/1985 | Young | 330/110 X |
| 4,602,218 | 7/1986 | Vilmur et al. | 330/279 |
| 4,760,347 | 7/1988 | Li et al. | 330/127 |
| 4,791,380 | 12/1988 | Chiappetta | 327/513 X |
| 5,099,204 | 3/1992 | Wheatley, III | 330/279 |

OTHER PUBLICATIONS

Turner: "Schottky diode pair makes an rf detector stable", Electronics, May 2, 1974, pp. 94–95. (Also see Application p. 2).

*Primary Examiner*—Steven Mottola
*Attorney, Agent, or Firm*—Cushman Darby & Cushman IP Group of Pillsbury Madison Sutro LLP

[57] ABSTRACT

A detector for a portable telephone or the like samples RF transmit power, detects the sampled signal using a Schottky diode and uses a logarithmic amplifier to apply a compressive function to the post-detection signal. The compressive function emphasizes power level changes at the low end of the transmission spectrum and de-emphasizes power level changes at the high end of the transmission spectrum. In this way, the range of detected powers required to be processed by subsequent circuitry is reduced, thereby simplifying the design of the circuit. To improve stability of the detector with respect to temperature fluctuations, the semiconductor element in the amplifier which provides its logarithmic characteristics is temperature-compensated, as is the detector diode.

24 Claims, 3 Drawing Sheets

TEMPERATURE COMPENSATED WIDE DYNAMIC RANGE POWER DETECTION CIRCUITRY FOR PORTABLE RF TRANSMISSION TERMINALS

BACKGROUND OF THE INVENTION

1. Field of the Invention

The present invention is directed to radio frequency amplifier circuits. More particularly, the invention is directed to wide dynamic range power amplifiers used in portable telephones and the like to provide efficient and stable use of wireless bandwidth.

2. Description of Related Art

Radio frequency (RF) transmitters generally have an RF power amplifier which receives a modulated transmit signal at a nominal power level and amplifies it to a relatively high power level for transmission via an antenna. As shown in FIG. 1, the output of the RF power amplifier 10 is typically sampled by a detector 12 (usually a Schottky diode-capacitor circuit acting as a half-wave rectifier) via a coupling capacitor 14. The detected signal is provided to a comparator 16 which compares the detected signal to a reference signal and drives an amplifier gain controller 18. The output of the amplifier gain controller 18 is used to control the gain of the RF power amplifier 10.

The use of a diode detector in this way has its disadvantages. For example, the diode is quite temperature sensitive and its forward voltage drop typically changes by $-2$ mV/° C.; thus, the forward voltage of a typical silicon diode which is 500 mV at room temperature can vary from 370 mV to 590 mV over a range of 90° C. to $-20°$ C. Moreover, the rate of change with respect to temperature is further dependent on the diode bias current.

U.S. Pat. No. 4,523,155 to Walczak et al. attempts to overcome this problem by biasing the input of the detector using a similar diode to compensate for temperature-induced variations in the detector's forward voltage drop. "Schottky Diode Pair Makes an RF Detector Stable", by R. J. Turner, *Electronics*, May 2, 1974 pp. 94–5, discloses a similar arrangement where the detector diode and a compensation diode are connected to separate inputs of a differential amplifier so that drifts in one are cancelled by corresponding drifts in the other.

U.S. Pat. No. 4,602,218 to Vilmur et al. discloses another approach to the temperature instability problem. In this device, the RF power amplifier output is sampled and nonlinearly compressed by a logarithmic amplifier before being supplied to the detector. Since the signal applied to the detector has a smaller potential voltage swing, the detector can be operated in a range where temperature-induced variations are minimized. This approach requires the use of relatively expensive RF range components to implement the logarithmic amplification function. Moreover, the use of such RF circuitry introduces the possibility of aberrant oscillations and unwanted emissions.

U.S. Pat. No. 5,099,204 to Wheatley, III discloses a similar system in which a compensation circuit generating a logarithmic signal responsive to an automatic gain control (AGC) signal controls the gain of cascaded amplifiers so that the amplifiers produce an RF signal which is logarithmically scaled. A temperature compensation diode is provided on one input of an operational amplifier (op-amp) in the compensation circuit.

U.S. Pat. No. 4,760,347 to Li et al. discloses a feedback loop formed by sampling the RF power amplifier output, detecting it using a rectifier, comparing the detected signal to a reference signal, and driving the RF power amplifier using the comparison signal. In this device, however, the rectifier's impedance is biased based on an external control signal. In this way, use of the rectifier within a relatively narrow range is possible, thereby avoiding temperature-induced operational variations.

On another point, radio frequency transmitters used in portable communication systems such as cellular telephones, Personal Handy Phone systems (PHS) and Personal Digital Cellular (PDC) systems generally utilize the above-described arrangement in which a feedback loop is implemented using a detector to monitor the output of the RF power amplifier; however, due to the widespread popularity of these systems, it is important that such devices additionally be able to control the power level of the output signal from outside the feedback loop.

For example, in a cellular environment, units must be able to transmit at fairly low power levels when necessary to avoid interference with other units on the same frequency. Present cellular standards require that the RF power amplifier have a dynamic power transmission range from 631 mW, or +28 dBm, to 400 μW, or $-4$ dBm in roughly exponential steps. The Walczak et al. and Vilmur et al. devices described above also include an analog multiplexer outputting a power level control signal based on an external digital signal selecting one of multiple amplifier power levels, and the RF power amplifier is driven by automatic output control circuitry based on the detector output and the power level control signal.

These techniques are workable and permit the use of a lower-resolution A/D converter, i.e., one having fewer bits; however, since most stock A/D converters provide eight output bits or more, the savings is usually wasted, or the additional bits are used to provided unneeded detection accuracy. In either case, the analog multiplexing technique adds complexity and cost to the system while providing little real benefit.

Another prior art technique increases the output voltage swing of the op-amp by, e.g., using an op-amp operating from a bipolar power supply or from a relatively high voltage single rail power supply so that the amplifier does not clip even at maximum input power. This method, however, requires a more expensive high resolution A/D converter to resolve low-level power changes. Also, provision of a high voltage rail or a bipolar supply may not be feasible in portable devices.

SUMMARY OF THE INVENTION

In view of the above-described problems of the prior art, it is an object of the present invention to provide a detector which is sensitive over a wide dynamic range, stable with respect to temperature changes, and which has high noise immunity.

It is another object of the present invention to provide a stable detector which has a simple structure, low cost and can operate with a simple power supply.

It is a further object of the present invention to provide a stable RF detector which is usable in portable communications devices such as personal telephones and the like.

It is yet another object of the present invention to provide a stable detector which can facilitate the establishment of power loop control between a base station and a remote unit.

It is still another object of the present invention to provide a detector which facilitates the reuse of bandwidth in limited bandwidth communication environments.

It is an even further object of the present invention to provide a detector providing a detection signal whose error is evenly distributed through a range of power levels.

It is a further object of the present invention to provide a sensitive detector which can minimize the amount of power diverted from a transmit signal.

The above objects are achieved according to an aspect of the invention by providing a detector which includes a nonlinear element applying a compressive function to the post-detection signal. The compressive function emphasizes power level changes at the low end of the transmission spectrum and de-emphasizes power level changes at the high end of the transmission spectrum. In this way, the range of detected powers required to be processed by subsequent circuitry is reduced, thereby simplifying the design of the circuit.

Preferably, the non-linear element is a logarithmic amplifier using a semiconductor element such as a diode or transistor to provide the logarithmic characteristics. Also, it is preferable that the logarithmic amplifier, as well as the detector, be temperature-compensated.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

Figure 2:
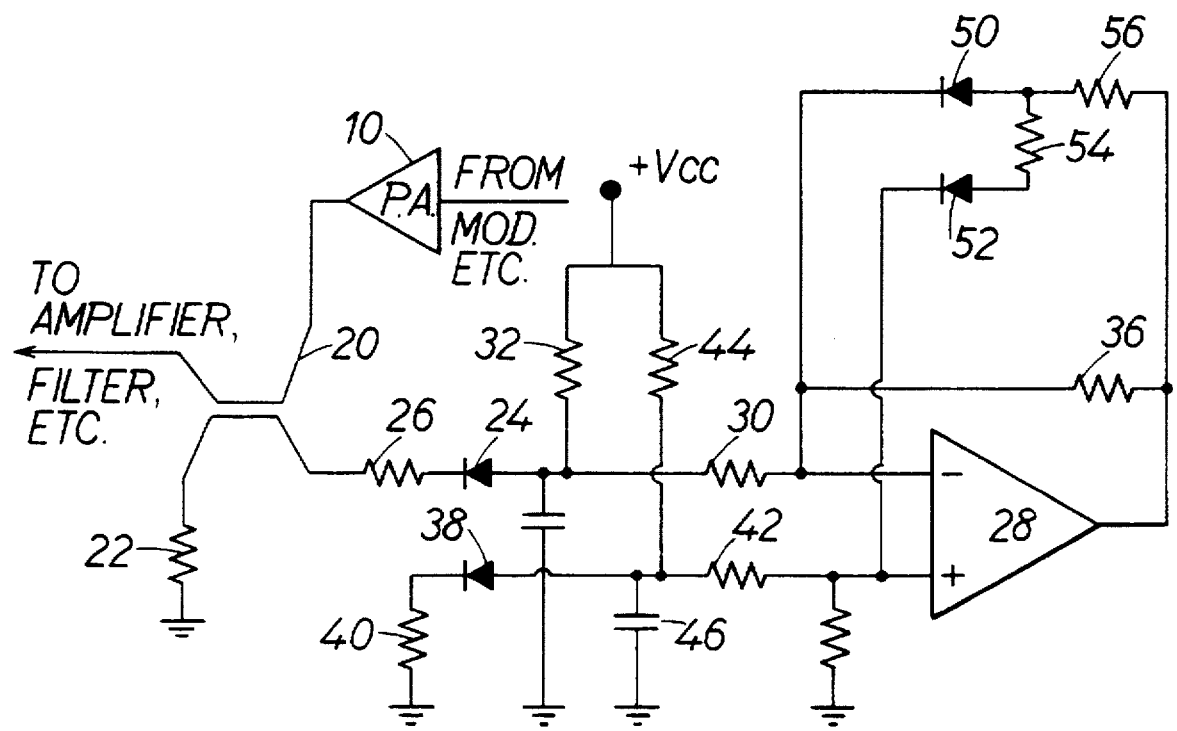
FIG. 2 is a schematic diagram of a detector according to a first preferred embodiment of the present invention.

A first preferred embodiment of the present invention will now be described with reference to FIG. 2. In this Figure, the output of the RF power amplifier 10 is sampled by a directional coupler 20. One terminal of the input side of the directional coupler 20 is connected to the RF power amplifier 10, and the other terminal thereof is connected to a transmitting antenna, output filter or the like (not shown). One terminal of the output side of the directional coupler 20 is connected to a termination resistor 22, and the termination resistor 22 has a resistance selected to correspond to the impedance of an impedance matching resistor 26 and other detector circuitry connected to the other terminal of the output side of the directional coupler 20. Without the termination resistor 22 or the impedance matching resistor 26, the directional coupler 20 could be unbalanced, thereby causing its coupling ratio to change.

A broadside printed directional coupler is used in this embodiment because its directivity ensures that only outgoing transmit power is sampled and that transmit power reflected from a mismatched antenna or the like is not additionally provided to the detector. Moreover, since there is no DC path between the RF power amplifier 10 and the detector, there is no need for a DC blocking capacitor to eliminate DC components from the detector input, as in the prior art circuits. Of course, the present invention is not limited to the use of a directional coupler to sample the output of RF amplifier 10, and other devices such as a coupling capacitor, energy field probe, or the like may be used as well.

Also, for theoretically optimal performance, an inductor should be used in place of impedance matching resistor 26 to provide a reactive matching load to the directional coupler 20; however, a resistor is preferably used in practice because, although it reduces the detector bandwidth slightly, it costs less and is more reliable than an equivalent inductor.

The signal from the directional coupler 20 is provided to the cathode of a detector diode 24 in a negative peak detector configuration via the impedance matching resistor 26. The anode of the detector diode 24 is connected to the inverting input of an op-amp 28 via an input resistor 30. The voltage at the anode of the detector diode 24 is pulled up via a pull-up resistor 32. In conjunction with the input resistor 30, pull-up resistor 32 and a gain resistor 36 (to be described in greater detail below), filter capacitor 34 connected between the anode of the detector diode 24 and ground forms a low-pass RC filter to provide a non-distorted detected envelope of the transmit signal to the op-amp 28.

More specifically, as seen from the anode of detector diode 24, resistors 30, 32 and 36 appear to be connected in parallel to ground. Thus, the filter capacitor 34 and the effective parallel resistance formed by resistors 30, 32 and 36 form a parallel RC low pass-filter circuit. If the values of the filter capacitor 34 and the resistors 30, 32 and 36 are chosen so that the time constant of the RC circuit is too long, the filter output will overshoot the detected envelope and provide a distorted input to the op-amp 28. On the other hand, if the values of the RC circuit components are chosen so that the time constant of the RC circuit is too short, the input to the op-amp will essentially track the carrier of the modulated transmit signal. As is known in the art, it can be shown that the component values should be chosen to satisfy Equation (1) below:

$$F_{max} = \frac{\sqrt{\frac{1}{m^2} - 1}}{2\pi R_p C_{34}} \tag{1}$$

where $F_{max}$ is the maximum carrier frequency to be detected, m is the modulation coefficient of the transmit signal, $R_p$ is the effective parallel resistance of resistors 30, 32 and 36, and $C_{34}$ is the capacitance of filter capacitor 34.

As used herein, a subscripted variable "R" or "C" refers to the resistance or capacitance, respectively, of the corresponding circuit component; e.g., "$C_{34}$" is the capacitance of filter capacitor 34.

A similar network including a temperature compensation diode 38, offset resistor 40, input resistor 42, pull-up resistor 44 and filter capacitor 46 is connected to the non-inverting input of the op-amp 28; however, the offset resistor 40 is connected to ground. Preferably, detector diode 24 and temperature compensation diode 38 are Schottky diodes, and also are preferably matched diodes.

The bias current flowing through the detector diode 24 is determined by the series configuration of resistors 22, 26 and 32, and the bias current flowing through the compensation diode 38 is determined by the series configuration of resistors 40 and 44. To ensure optimal temperature compensation, these two bias currents should be equal so that op-amp 28 can null out the temperature differences in the two input paths. This in turn requires that the total series resistances be equal as shown in Equation (2) below.

$$R_{22}+R_{26}+R_{32}=R_{40}+R_{42} \quad (2)$$

Op-amp 28, along with input resistors 30 and 42, gain resistor 36 and bias resistor 48 forms a differential amplifier. It can be shown using techniques known in the art that the input impedance of the amplifier is $R_{30}+R_{42}$, and that the output $V_{out}$ of the differential amplifier is given by Equation (3):

$$V_{out}=R_{36}/R_{30}(V_+-V_-) \quad (3)$$

where $V_+$ and $V_-$ are the voltages at the anodes of diodes 38 and 24, respectively.

The above considerations notwithstanding, it is preferable to set $R_{40}$ to be higher than the series resistance $R_{22}+R_{26}$ to provide an offset for the output of the op-amp 28 and enable use of a single rail power supply.

That is, ideally the resistance of resistor 40 should be equal to the series resistance of resistors 22 and 26 to provide a balanced amplifier output; however, when using a single rail power supply, the lowest possible voltage the op-amp 28 can output is the drain-source voltage $V_{ds}$ (for an FET transistor) or collector-emitter voltage $V_{ce}$ (for a bipolar transistor) of its output transistor, assuming the source or emitter is grounded. In this case, when the op-amp 28 should be outputting zero volts, its output actually floats somewhere between zero and $V_{ds}$ or $V_{ce}$. By increasing the resistance of the resistor 40, the op-amp 28 can be biased to generate a positive DC offset for zero differential input. This offset theoretically slightly impairs the immunity of the circuit to temperature changes; however, its actual effect is almost negligible, and it provides a substantial benefit in that a single rail power supply may be used, thus simplifying the structure of the circuit in which it is implemented and reducing manufacturing costs.

The behavior of the differential amplifier, however, is modified by the network consisting of diodes 50 and 52 and resistors 54 and 56. To understand the effect of this network on the differential amplifier, consider a similar amplifier circuit in which amplifier feedback is provided by a parallel combination of resistor 36 and diode 50. As is well-known in the art, this is a differential input logarithmic amplifier circuit.

When the difference between $V_+$ and $V_-$ is small, diode 50 is off and all feedback passes through resistor 36. When the differential input exceeds the turn-on voltage of diode 50, e.g., 0.6 V, the diode forms a parallel circuit with the resistor 36, thereby reducing its resistance and, in accordance with Equation (3) above, reducing the gain of the differential amplifier. Higher differential inputs result in higher feedback voltages and, since the voltage drop across diode 50 is constant (save for the above-noted temperature-dependent effects), more of the feedback current flows through the diode 50 rather than the resistor 36. This action gives the amplifier its logarithmic transfer function.

Now, consider an amplifier circuit which includes the diodes 50 and 52 but eliminates the resistors 54 and 56. In this case, the amplifier exhibits no logarithmic effects since any change in the feedback to the inverting input of the op-amp 28 will be matched by a corresponding change in the feedback to the non-inverting input of the op-amp 28 (preferably, diodes 50 and 52 are matched). Inserting resistor 54, however, will shift more of the feedback current from the diode 52 to the diode 50. Thus, the higher the value of resistor 54, the more pronounced the logarithmic characteristics of the amplifier. Similarly, inserting resistor 56 will shift more of the feedback current from the diode network to the feedback resistor 36.

Providing the logarithmic function is done at the expense of temperature stability of the circuit, however. When the diodes 50 and 52 are used without the resistors 54 and 56, any temperature-induced change in the feedback current to the inverting input of the operational amplifier 28 through the diode 50 is matched by a corresponding temperature-induced change in the feedback current to the non-inverting input of the op-amp 28 through the diode 52. When more feedback current passes through diode 50 to provide logarithmic amplification, the compensatory effect of diode 52 thereto decreases correspondingly. In practice, however, a reasonable tradeoff can be reached, and temperature stability of ±0.5 dB throughout a range of −30° C. to 70° C. can be obtained.

Figure 1:
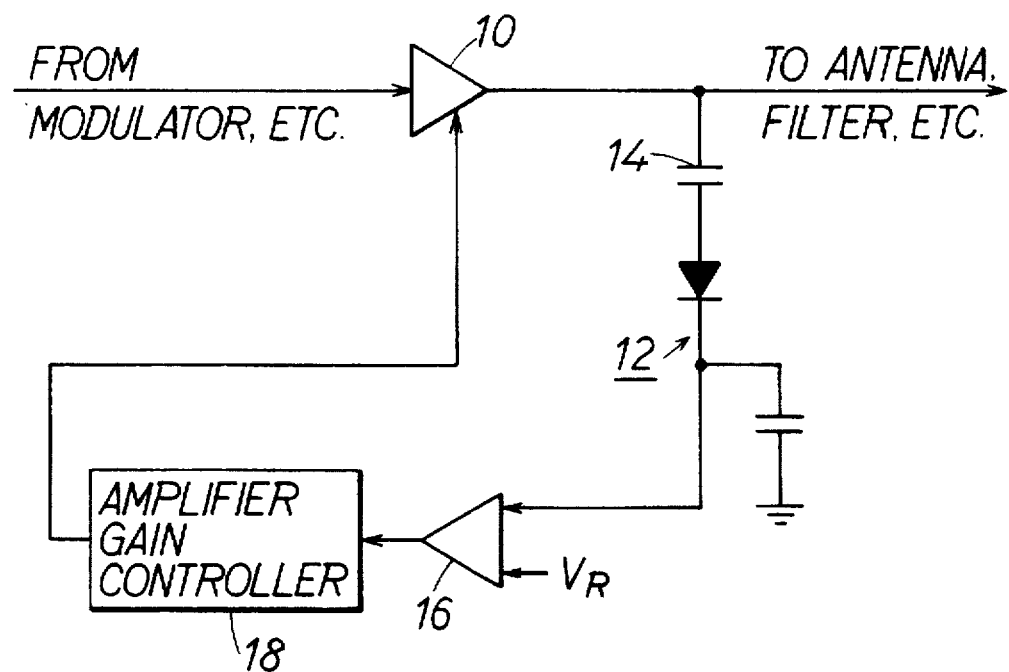
FIG. 1 is a block diagram of an output section of a transmitter according to the prior art.
Figure 3:
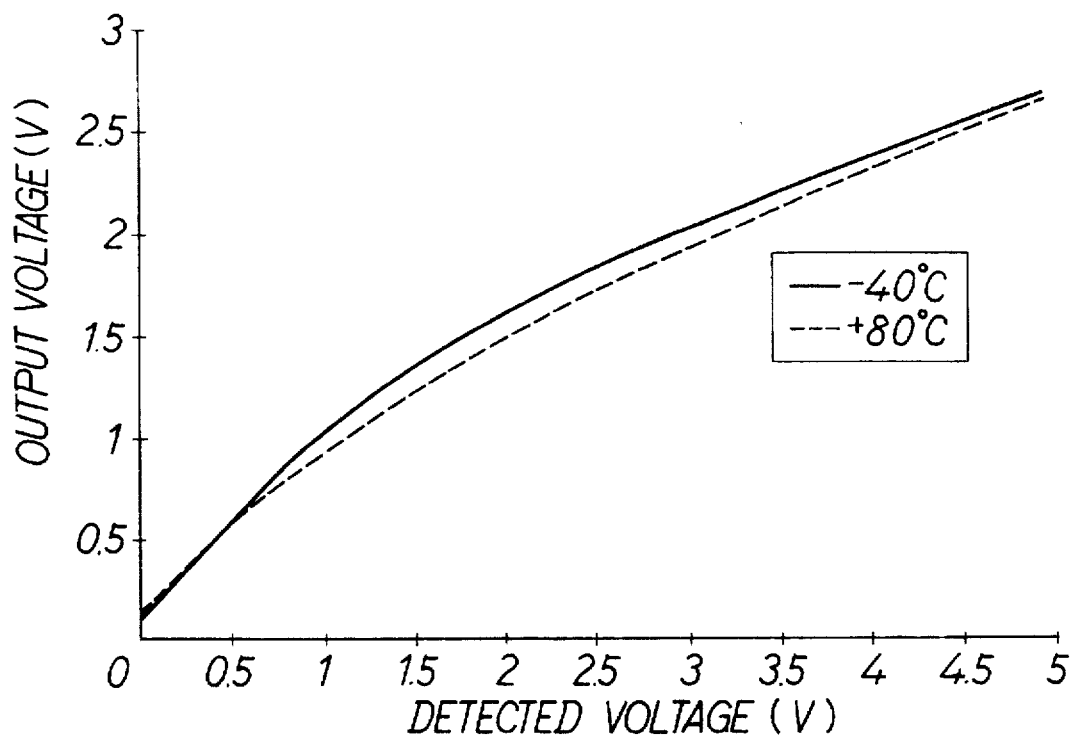
FIG. 3 is a graph showing the performance of the circuit of FIG. 2 with respect to changes in temperature.

FIG. 3 shows a plot of detected voltage at the input of the circuit shown in FIG. 1 versus output voltage thereof when the circuit is operated at two temperature extremes, −40° C. and 80° C. As can be seen, the curves match each other closely and approximate a logarithmic curve. Using an unmatched diode pair, the worst power error is +/−1 dBm at a power amplifier output range of 15 to 20 dBm. This is well within the specifications for modern portable communication devices.

The above circuit configuration provides advantages not seen in the prior art. For example, the use of the logarithmic amplifier means that the detector is sensitive over a wide dynamic range of input signals. Since the detector is highly sensitive, a directional coupler 20 having a high coupling ratio to divert only a small amount of power from the main transmit path can be used, thereby increasing the efficiency of the device. Moreover, the use of the differential input amplifier means that the noise immunity of the circuit is equal to the common mode rejection ratio of the operational amplifier.

Further, in conjunction with the temperature compensation of the detector diode 24, temperature compensation of the amplifier means that the circuit is extremely stable with respect to variations in temperature. Also, due to the compression of the detected signal by the logarithmic amplifier, any error in subsequent digitization of the detected signal for power loop control will be evenly logarithimically distributed over the power level transmission spectrum.

Figure 4:
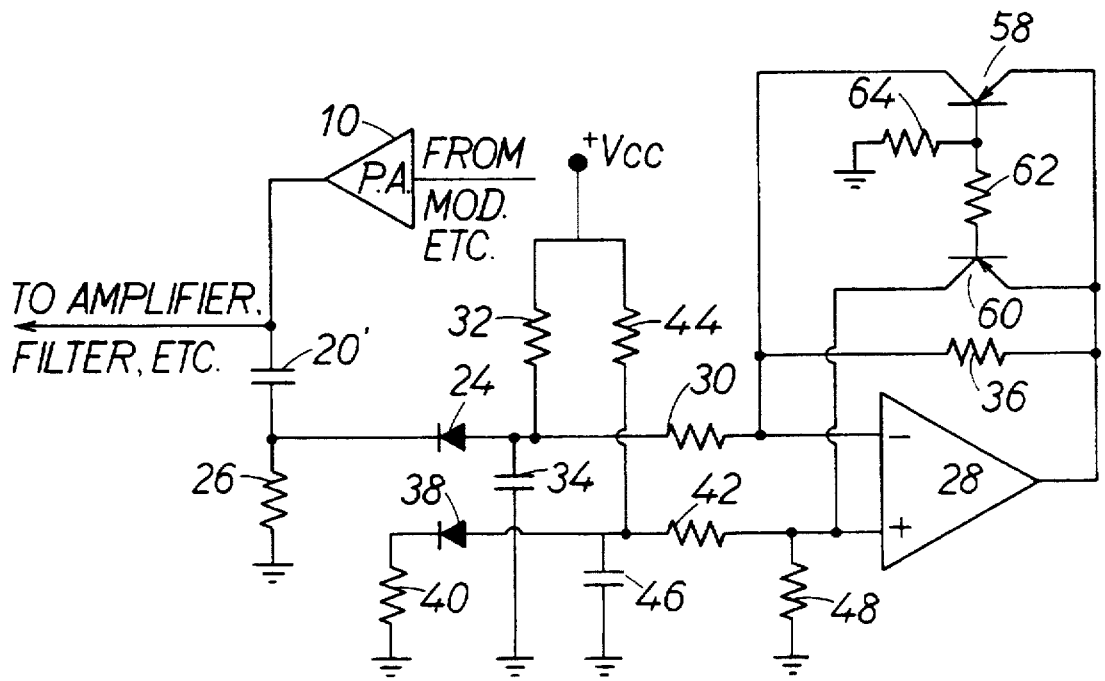
FIG. 4 is a schematic diagram of a detector according to a second preferred embodiment of the present invention.
Figure 5:
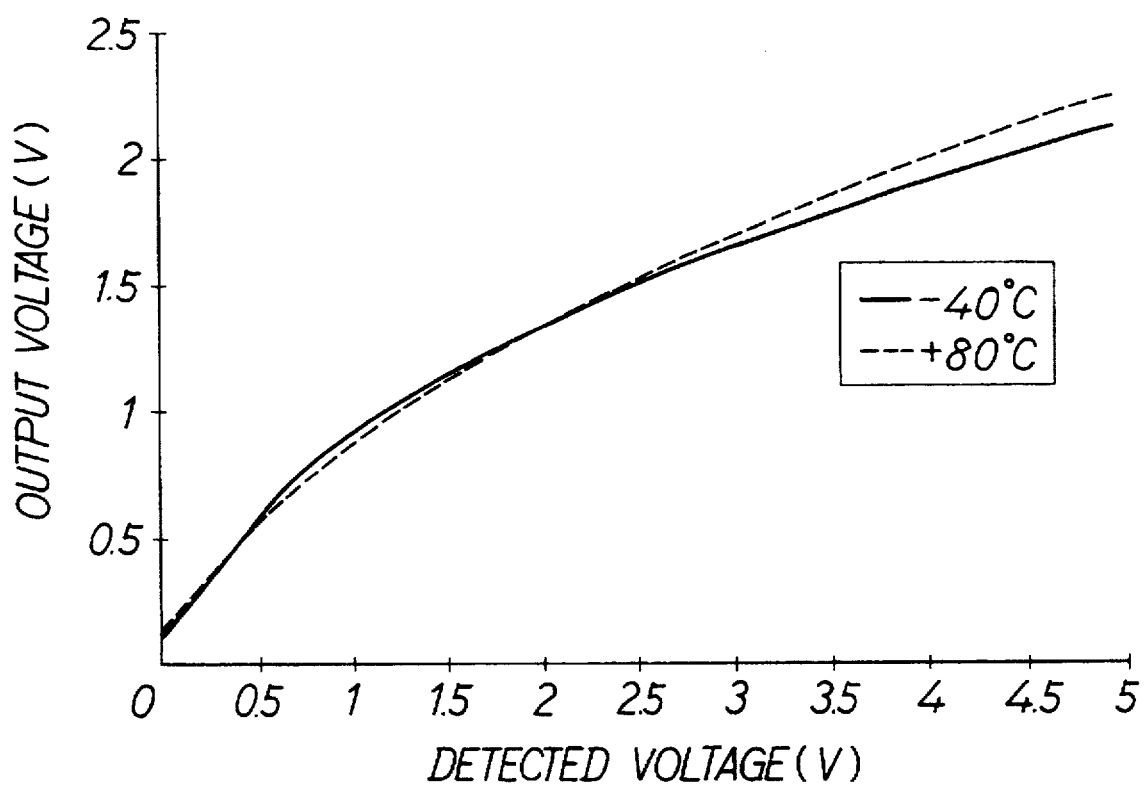
FIG. 5 is a graph showing the performance of the circuit of FIG. 4 with respect to changes in temperature.

Instead of the diodes 50 and 52, a second embodiment of the present invention shown in FIG. 4 uses transistors 58 and 60 (preferably, these too are matched) to provide the logarithmic function shown in FIG. 5. In this Figure, resistor 62 performs a function similar to that of resistor 54 in the first embodiment in that it controls the flow of feedback current through transistor 60 relative to that through transistor 58, and resistor 64 performs a function similar to that of resistor 56 in the first embodiment in that it controls the flow of feedback current through the transistor network relative to that through the feedback resistor 36.

It should also be noted that this embodiment employs a coupling capacitor 20' in place of the directional coupler 20 and termination resistor 22 used in the first embodiment.

Preferred values for components of a detector circuit according to the second embodiment of the present invention for handling frequencies of DC to 2 GHz (typical of cellular and PCS portable communication devices) are shown in TABLE I. This circuit is capable of drawing less than 1 mA from a single rail +3 V power supply. Of course, these are only preferred components, and particular values for a given implementation will be readily apparent to those of ordinary skill in the art.

TABLE I

| | |
|---|---|
| $R_{26}$ | 1 kΩ |
| $R_{30}$ | 430 kΩ |
| $R_{32}$ | 150 kΩ |
| $R_{36}$ | 430 kΩ |
| $R_{40}$ | 6.8 kΩ |
| $R_{42}$ | 430 kΩ |
| $R_{44}$ | 150 kΩ |
| $R_{49}$ | 430 kΩ |
| $R_{62}$ | 20 kΩ |
| $R_{64}$ | 820 kΩ |
| $C_{34}$ | 0.1 μF |
| $C_{46}$ | 0.1 μF |
| $D_{24}$ | Hewlett-Packard HSMS 2825 |
| $D_{38}$ | Hewlett-Packard HSMS 2825 |
| $Q_{58}$ | Rohm UMS1N |
| $Q_{60}$ | Rohm UMS1N |
| U1 | Toshiba TC 75S54F |

Use of the transistors 58 and 60 permits some gain to be injected into the feedback loop of amplifier 28. Thus, the ratio of $R_{62}$ to $R_{64}$ can be lowered while maintaining a given logarithmic compression rate. As can be seen from the graph of detected input voltage versus output voltage for this circuit shown in FIG. 5, the curves at the temperature extremes track each other more closely in the lower ranges and have an additional crossover point. Using an unmatched transistor pair, a tolerance of −0.8/+0.5 dB over the −40° C. to +80° C. temperature range is possible within a power amplifier output range of +14 to +18 dBm. In low power ranges such as those below −3 dBm, the tolerance is better than +/−2 dB. Overall, the compression ratio is better than 3 to 2.

Although the present invention has been fully described in connection with the preferred embodiment thereof with reference to the accompanying drawings, it is to be noted that various changes and modifications will become apparent to those skilled in the art. For example:

- in the op-amp feedback network, a resistor need not be provided in the branch connected to the non-inverting input, but may instead be provided in the branch connected to the inverting input;
- a common resistor for both branches of the network need not be used; rather, dedicated resistors for each branch thereof may be used instead;
- the diodes or transistors need not be matched, but may be unmatched devices as long as their temperature characteristics substantially correspond to one another, "substantially" as used herein and in the appended claims meaning that the characteristics conform to a degree sufficient to provide practical, usable temperature compensation in the overall communication device;
- the circuit need not use diodes or bipolar transistors, but may use other suitable elements such as field-effect transistors or the like;
- the detection function need not be implemented using the specific diode arrangement disclosed herein, but may be used in conjunction with various other temperature compensated and non-compensated circuits as are known in the art;
- the amplifier need not be a logarithmic amplifier circuit, but may implement a different suitable non-linear function which exhibits high-end compression.
- the circuit need not be used in a system implementing power loop control with a base station, and may be used in open loop systems as well;
- detectors according to the present invention are not limited to use in monitoring transmit power, but may also be used in receivers; and
- the circuit need not be used with RF circuits, and may be used in other frequency ranges as well.

Such changes and modifications are to be understood as being included within the scope of the present invention as defined by the appended claims.

What is claimed is:

1. A temperature compensated logarithmic amplifier comprising:

an amplifier, having an output and a plurality of inputs, for generating a logarithmically amplified output signal corresponding to signals at said plurality of inputs; and a feedback circuit connecting said amplifier output to said plurality of amplifier inputs, said feedback circuit including a first nonlinear element, having a first temperature characteristic, connecting said amplifier output to a first one of said plurality of amplifier inputs for applying a nonlinear function to said logarithmically amplified output signal, and a second nonlinear element, having a second temperature characteristic substantially identical to said characteristic of said first nonlinear element, connecting said amplifier output to a second one of said plurality of amplifier inputs for applying a nonlinear function to said logarithmically amplified output signal;

wherein a component of a signal provided to said first one of said plurality of amplifier inputs by said first nonlinear element due to said first temperature characteristic is accompanied by a corresponding component of a signal provided to said second one of said plurality of amplifier inputs by said second nonlinear element due to said second temperature characteristic.

2. The amplifier of claim 1, wherein:

said amplifier is an operational amplifier configured to operate as a differential amplifier;

said first and second nonlinear elements are semiconductor devices for applying logarithmic functions to said amplifier output signal; and outputs of said semiconductor devices are respectively connected to an inverting input and a non-inverting input of said operational amplifier.

3. The amplifier of claim 2, wherein said semiconductor devices are diodes.

4. The amplifier of claim 3, further comprising:

a first resistor connecting said amplifier output to an input of a first one of said diodes; and a second resistor connecting an input of a second one of said diodes to said input of said first one of said diodes and to said first resistor.

5. The amplifier of claim 2, wherein said semiconductor devices are transistors.

6. The amplifier of claim 5, further comprising:

a first resistor connecting a terminal of a first one of said transistors to a reference potential; and a second resistor connecting a corresponding terminal of a second one of said transistors to said terminal of said first transistor and to said first resistor.

7. A detector for detecting a radio signal, said detector comprising:
- a detector element for receiving a radio signal at an input thereof and for generating a detected signal corresponding to said radio signal at an output thereof; and
- a nonlinear amplifier section for receiving said detected signal at an input thereof, applying a continuous nonlinear function to said detected signal, and generating an output signal corresponding thereto at an output of said amplifier section, said nonlinear amplifier section including a linear amplifier and a nonlinear feedback network providing a DC feedback path between an output of said amplifier and an input thereof.

8. The detector of claim 7, wherein:
- said linear amplifier is an operational amplifier configured to operate as a differential amplifier; and
- said feedback network is for applying a logarithmic function to said output signal of said operational amplifier.

9. The detector of claim 7, said feedback network comprising a first nonlinear element for receiving said output signal of said linear amplifier at an input thereof and for generating said transformed output signal at an output thereof.

10. The detector of claim 9, wherein:
- said linear amplifier is an operational amplifier;
- said output of said first nonlinear element is connected to an inverting input of said operational amplifier.

11. A detector for detecting a radio signal, said detector comprising:
- a detector element for receiving a radio signal at an input thereof and for generating a detected signal corresponding to said radio signal at an output thereof, and
- a nonlinear amplifier section for receiving said detected signal at an input thereof, applying a continuous nonlinear function to said detected signal, and generating an output signal corresponding thereto at an output of said nonlinear amplifier section, said nonlinear amplifier section including an amplifier having a plurality of inputs, and a feedback network for applying a nonlinear transformation to an output signal of said amplifier and providing said transformed output signal to said amplifier; said feedback network including
- a first nonlinear element for receiving said output signal of said amplifier at an input thereof, generating said transformed output signal at an output thereof and providing said transformed output signal to a first one of said plurality of inputs of said amplifier, and a second nonlinear element for receiving said output signal of said amplifier at an input thereof, generating a transformed output signal at an output thereof and providing the same to a second one of said plurality of inputs of said amplifier.

12. The detector of claim 11, wherein said first and second nonlinear elements are diodes.

13. The detector of claim 11, wherein said first and second nonlinear elements are transistors.

14. A detecting signal output circuit for generating a detected DC signal for checking an amplifying rate of radio frequency signals by picking up a portion of radio frequency signals amplified by an amplifier, said circuit comprising:
- means for sampling a portion of an output of said amplifier;
- a rectifying diode for rectifying said portion of said amplifier output sampled by said sampling means to make a sampled signal;
- a reference voltage circuit for producing a reference voltage from a power source; and
- a nonlinear amplifier, to which said sampled signal and said reference voltage are provided as inputs, for differentially and nonlinearly amplifying said inputs so that said sampled signal is compressed when it has a high power level and for generating said detected DC signal as an output thereof.

15. The circuit of claim 14, said reference voltage circuit comprising a temperature compensating diode for compensating temperature characteristics of said rectifying diode.

16. The circuit of claim 15, wherein said circuit is connected so that electricity flows to said rectifying diode and said temperature compensating diode, anodes of said rectifying diode and said temperature compensating diode being connected to respective inputs of said non-linear amplifier.

17. The circuit of claim 14, wherein said nonlinear amplifier is a logarithmic amplifier.

18. The circuit of claim 17, said logarithmic amplifier comprising:
- a pair of transistors for providing feedback of said input signals after amplification; and
- a resistor serving as a common base resistance of said pair of transistors.

19. The circuit of claim 17, wherein said logarithmic amplifier comprises:
- a pair of diodes for providing feedback of said input signals after amplification; and
- a resistor serving as a common anode side resistance of said pair of diodes.

20. The detector of claim 7, wherein said nonlinear amplifier section includes a differential amplifier.

21. The detector of claim 7, wherein said nonlinear amplifier section is for applying a logarithmic function to said detected signal and for generating a logarithmic output signal corresponding thereto at an output of said amplifier section.

22. The detector of claim 7, wherein:
- said nonlinear amplifier section has first and second inputs; and
- said nonlinear amplifier section includes a feedback network for receiving said output signal of said nonlinear amplifier section, separately applying first and second nonlinear functions to said output signal to obtain first and second nonlinear signals, and respectively supplying said first and second nonlinear signals to said first and second nonlinear amplifier section inputs.

23. The detector of claim 7, wherein said feedback network includes a forward-biased diode.

24. The detector of claim 7, wherein said feedback network includes a nonlinear element and is for applying a nonlinear function to said output signal of said linear amplifier using a constant voltage drop of said nonlinear element.

* * * * *